US007313027B2

(12) United States Patent
Hosono (10) Patent No.: US 7,313,027 B2
(45) Date of Patent: Dec. 25, 2007

(54) NONVOLATILE SEMICONDUCTOR MEMORY DEVICE AND A METHOD OF WORD LINES THEREOF

(75) Inventor: Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 11/295,567

(22) Filed: Dec. 7, 2005

(65) Prior Publication Data
US 2006/0133143 A1 Jun. 22, 2006

(30) Foreign Application Priority Data
Dec. 8, 2004 (JP) ............................. 2004-354942

(51) Int. Cl.
*G11C 11/34* (2006.01)
(52) U.S. Cl. .............................. 365/185.23; 365/185.18
(58) Field of Classification Search ........... 365/185.23, 365/185.18, 185.11
See application file for complete search history.

(56) References Cited

U.S. PATENT DOCUMENTS

| 5,621,684 | A | 4/1997 | Jung |
| 5,715,194 | A | 2/1998 | Hu |
| 6,507,508 | B2 | 1/2003 | Hosono et al. |
| 6,522,583 | B2 * | 2/2003 | Kanda et al. ........... 365/185.17 |
| 6,690,596 | B2 | 2/2004 | Hosono et al. |
| 6,798,683 | B2 | 9/2004 | Hosono et al. |
| 6,839,283 | B1 | 1/2005 | Futatsuyama et al. |
| 6,859,395 | B2 * | 2/2005 | Matsunaga et al. ..... 365/185.18 |
| 7,184,308 | B2 * | 2/2007 | Kwon et al. ........... 365/185.17 |
| 2006/0250850 | A1 * | 11/2006 | Lee ........................ 365/185.18 |

FOREIGN PATENT DOCUMENTS

JP          2002-141477          5/2002

OTHER PUBLICATIONS

U.S. Appl. No. 11/295,567, filed Dec. 7, 2005, Hosono.

* cited by examiner

*Primary Examiner*—Anh Phung
(74) *Attorney, Agent, or Firm*—Oblon, Spivak, McClelland, Maier & Neustadt, P.C.

(57) ABSTRACT

A nonvolatile semiconductor memory device having a first circuit for selecting one from the plurality of blocks, the first circuit having a plurality of transistors connected to word lines connected to some of the nonvolatile memory cells and a second circuit for generating a first voltage V1, a second voltage V2 and a third voltage V3 (V3<V2<V1). The first voltage is applied to a source or drain of one of the transistors connected to a selected word line at a timing of programming. The second voltage is applied to sources or drains of some of the transistors connected to non-selected word lines at the timing of programming. The third voltage is applied to a source or a drain of one of the transistors connected to at least one of the non-selected word lines at the timing of programming.

20 Claims, 11 Drawing Sheets

NONVOLATILE SEMICONDUCTOR MEMORY DEVICE AND A METHOD OF WORD LINES THEREOF

CROSS-REFERENCES TO RELATED APPLICATIONS

This application is based on and claims the benefit of priority from the prior Japanese Patent Applications No. 2004-354942, filed on Dec. 8, 2004, the entire contents of which are incorporated herein by reference.

BACKGROUND OF THE INVENTION

1. Field of the Invention

This invention relates to an electrically reprogrammable non-volatile semiconductor memory device. Especially this invention relates to the voltage supply technology of a memory cell in a NAND type flash memory (a kind of a non-volatile semiconductor memory device).

2. Description of Related Art

Recently, the demand of nonvolatile semiconductor memory which is high density and large capacity is increasing in accordance with the growth of the application like silicon audio, digital still camera, and so on. Such applications require not only greater storage capacity but also higher program throughput. NAND flash memory meets those requirements, because of the small cell size and both the program operation and an erasure operation by using FN tunnel current. The memory cell size is about $4F^2$ (F is design feature size) formed in the intersection of the active region of Si, and the line pattern of a control gate. Therefore, compared with other nonvolatile memory, high integration of a memory cell can be realized. However, since the NAND flash memory retains data in nonvolatile manner with the amount of electric charges in a floating gate, shrinkage of the thickness of the tunnel oxide film is difficult. Thus, the voltages required for the program operation and the erase operation are retained, although high integration is progressed.

In a NAND type flash memory, the voltage beyond 20V is applied to selection gates of selection transistors, and control gates of memory cells in program operation or an erase operation. Therefore, high voltage tolerance transistors having thick gate oxide, sufficient junction voltage tolerance, and sufficient voltage tolerance between elements is used for transmission transistors for supplying signals to selection gate lines and word lines. Because of this situation, it will be necessary to arrange large transfer transistors in each block selection circuit, the transistor being larger than transistors which operates with the usual supply voltage. And the increase in efficiency of layout arrangement of the transistor is called for.

Adopting a layout configuration pattern without separation of gate patterns is known so that it may be indicated by the patent documents 1 (Japanese laid open patent 2002-141477). Moreover, by adopting how to put in order the transfer transistor which can make distance between transistors as small as possible, the technology which makes occupancy area of a block selection circuit as small as possible is known.

SUMMARY OF THE INVENTION

The nonvolatile semiconductor memory device according to an embodiment of the invention comprise:

a memory cell array having a plurality of blocks each including a plurality of electrically reprogrammable nonvolatile memory cells arranged in matrix;

a first circuit for selecting one from said plurality of blocks, said first circuit having a plurality of transistors connected to word lines connected to some of said nonvolatile memory cells; and a second circuit for generating a first voltage V1, a second voltage V2 and a third voltage V3 (V3<V2<V1), said first voltage V1, said second voltage V2 and said third voltage V3 being applied to sources or drains corresponding said plurality of transistors, said first voltage V1 being applied to a source or drain of one of said transistors connected to a selected word line at a timing of programming data, the second voltage V2 being applied to sources or drains of some of said transistors connected to non-selected word lines at the timing of programming data, and said third voltage V3 being applied to a source or a drain of one of said transistors connected to at least one of said non-selected word lines at the timing of programming data, said third voltage V3 being higher than a well or substrate voltage of said plurality of transistors, and said third voltage being the lowest among voltages applied to said sources or drains of said plurality of transistors applied in a period of the first voltage V1 and said second voltage V2 being applied to corresponding said word lines.

DETAILED DESCRIPTION OF THE PREFERRED EMBODIMENTS

Figure 1:
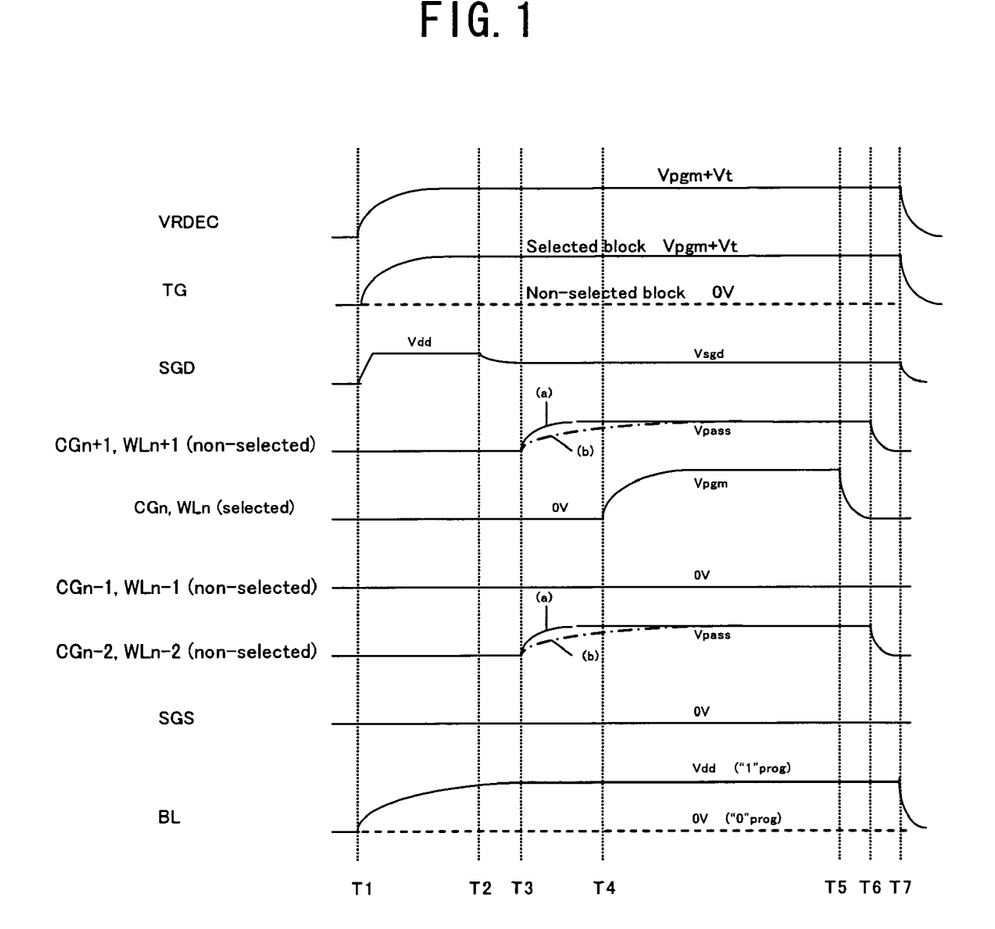
FIG. 1 is a timing chart in program operation of a non-volatile semiconductor memory device.

Here, the timing chart in program operation is shown in FIG. 1. WLn is a selected word line. Other Word lines WLn−2, WLn−1, and WLn+1 are non-selected word lines contained in the same selection block as the selected word line WLn as shown in FIG. 1. FIG. 1 is a timing chart of a selected word line WLn and non-selected word lines WLn+1, WLn−1 and WLn−2, word line drive lines CGn, CG+1, CG−1, and CGn−2 corresponding to the word lines. When the transfer transistors turn on, the potentials of the word line drive lines CGn, CG+1, CG−1, and CGn−2 becomes substantially equal to the potentials of the word lines WLn, WLn+1, WLn−1, and WLn−2, respectively. In FIG. 1, VRDEC is wiring to which voltages (voltage according to operation of a program/read-out) for transmitting to a block decoder is supplied. TG is gate wiring of a transfer transistor, SGD and SGS are selection gate drive lines, and BL is bit line. In one block, the memory transistors connected in series to one bit line is called a NAND type cell.

In the voltage supply method at the time of programming shown in FIG. 1, 0V is applied to the non-selected word line WLn−1, the first word line toward a source line (CELSRC) from the selected word line WLn. The path voltage Vpass (voltage characteristic to the program of a NAND type cell) is applied to non-selected word line WLn−2 second word line toward a source line. Vpass is applied also to the first non-selected word line WLn+1 from the selected word line WLn, toward the bit line side. Furthermore, Vpass is applied also to other non-selected word lines which are not shown in FIG. 1.

Program voltage Vpgm applied to the selected word line WLn is about 20V. In order to apply this voltage to the selected word line WLn, it is necessary to apply the voltage (transfer voltage) higher than transfer voltage Vpgm(20V)+Vt (Vt: threshold voltage of a transfer transistor) to the gate wiring TG of a transfer transistor. The transfer voltage Vpgm+Vt is supplied at timing T1 to a block decoder from a VRDEC driver. In the selected block, the voltage of the selection gate drive line SGD is transmitted to selection gate line SG1 connected to the selection transistor. And a NAND type cell becomes active and the voltage according to the program data applied to the bit line is supplied in each NAND type cell.

Figure 2:
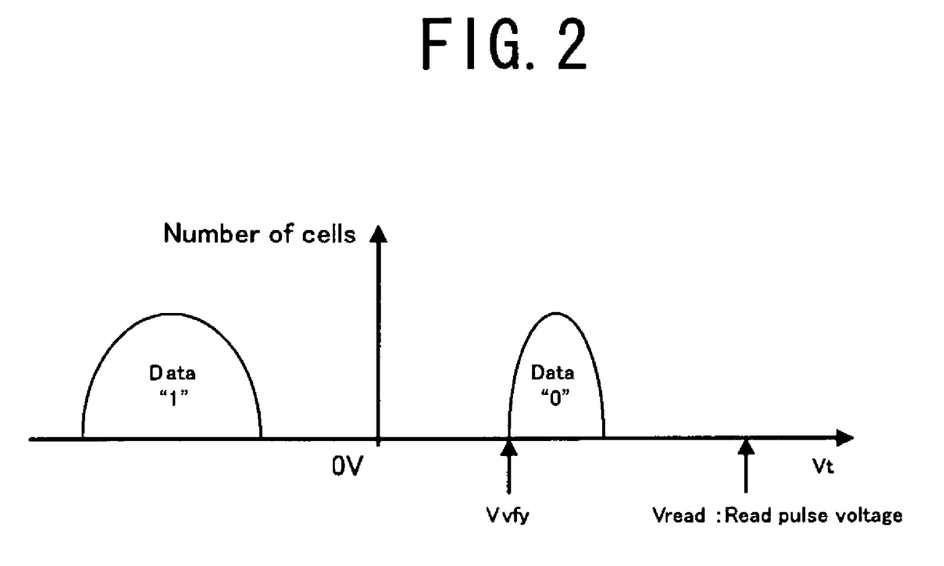
FIG. 2 is a figure showing the relation between the threshold voltage of the memory cells of a non-volatile semiconductor memory device, and data.

The relation between the threshold voltage of a memory cell and data is shown in FIG. 2. When the voltage of a bit line is 0V, 0V continues being supplied in a NAND type cell. Since sufficient electric field to cause FN tunnel current between a word line and the channel of a selection memory cell is applied during the programming period between timing T4 and timing T5, electrons are injected into a floating gate and it will be in the state ("0" states) where a threshold voltage is high. If word line potential rises and the potential of the channel and a diffusion regions in a NAND type cell become more than Vsgd−Vt (Vt is a threshold voltage of a selection transistor) after timing T3 when the voltage of a bit line is Vdd, it will be in a floating state and the potential will rise. By this, the potential difference of a word line and the channel of a selection memory cell become small. As a result, electrons are not injected into a floating gate but erase state "1" is maintained. Therefore, it is "1" program.

The reason which was setting to 0V voltage of non-selected word line WLn−1 which is adjacent to the source line (CELSRC) side of the selected word line WLn is explained. In a NAND type flash memory, the program to two or more word lines in a NAND type cell may be performed from the source line (CELSRC) side. When writing in order of WL0, WL1, . . . , WLi, it is possible that the memory cell in the source side from the selected word line WLn, has already been performed with program. On the other hand, the memory cells by the bit line side are still at an erasure state. In the above-mentioned "1" program, program disturbance will be happen. This has the data pattern dependability of the memory cells in a NAND type cell. To be more precise, the more the erased memory cells exist, the higher the potential of the memory cell channel regions and the diffusion regions raise, and a program disturbance becomes weaker. In order to utilize this phenomenon effectively, 0V is applied to non-selected word line WLn−1 in the source side of the selected word line WLn. The memory cell connected to non-selected word line WLn−1 serves as a boundary. The floating channel potential of the source side memory cell region can be separated from the floating channel potential of the memory cell region on the bit line side, including the memory cell (selection memory cell) connected to the selected word line WLn.

For example, the threshold voltage of a certain memory cell connected to non-selected word line WLn−1 is in an erased state, and a threshold voltage is −2V. For example, the potential of the channel region and the source-drain diffusion of the memory cell on the bit line side, and the potential of the channel region and the source-drain diffusion of the memory cell on the source line side are electrically separated by the memory cell connected to the non-selected word line WLn−1 due to the turn-off state while WLn is selected. For this reason, the channel and diffusion region potential of the memory cells which are in the bit line side rather than a selection memory cell and a selection memory cell rise more efficiently.

Figure 3:
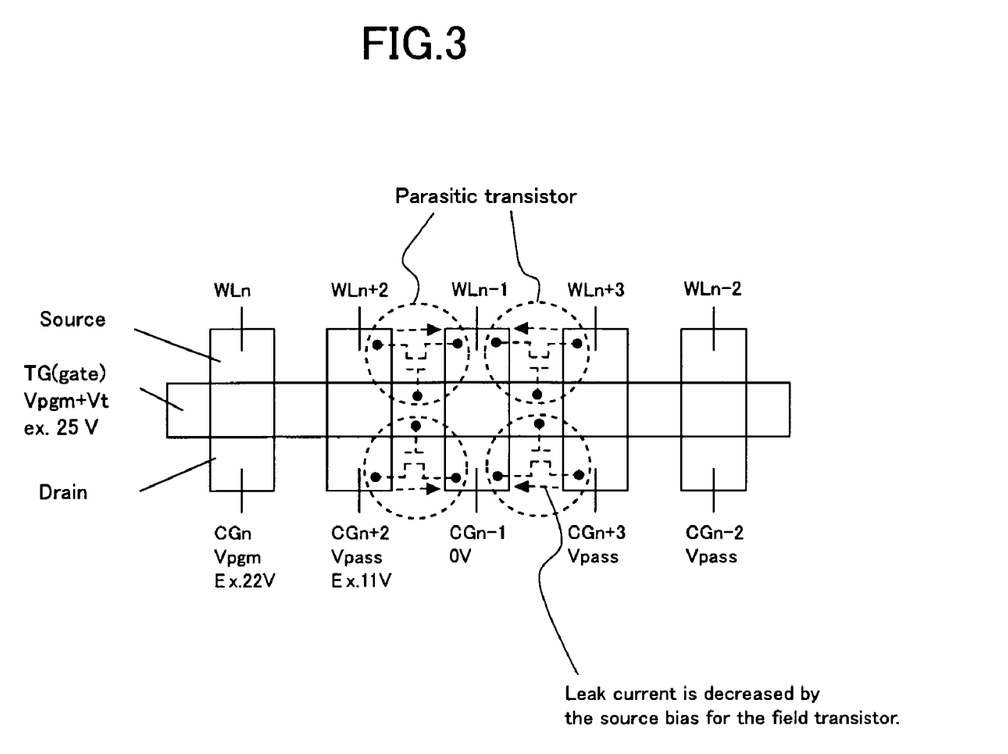
FIG. 3 is a figure showing layout arrangement of the transfer transistor in an embodiment of the non-volatile semiconductor memory device.

However, if the above-mentioned bias relations are introduced into program operation, the following problems will arise. The layout arrangement currently indicated by the patent documents 1 is shown in FIG. 3. This arrangement has adopted the layout configuration pattern without gate pattern separation. This arrangement has adopted how to put in order a transfer transistor with a small distance between transistors. In the layout arrangement shown in FIG. 3, transfer transistors connected to the word lines WLn, WLn+2, WLn−1, WLn+3, and WLn−2 are arranged in this turn.

Vpgm is applied to the drain of the transfer transistor connected to the selected word line WLn at the time of the programming. 0V is applied to the drain of the transfer transistor which was connected to non-selected word line WLn−1 simultaneously. As a result, in layout arrangement as shown in FIG. 3, sufficient consideration of the leak current between adjacent transistors is necessary. In this case, Vpgm+Vt for transmitting program voltage Vpgm is applied to the gate which forms the field (MOS) transistor (parasitic transistor). Therefore, the surface of the field transistor might be reversed.

As shown in FIG. 3, the arrangement is also possible so that the potential difference between adjacent transistors may become small. In FIG. 3, the transfer transistor to which Vpgm is applied, and the transfer transistor to which Vpass is applied are located to adjacent. Further, the transfer transistor to which 0V is applied, and the transfer transistor to which Vpass is applied are adjacent. However, if a field transistor will be in a reversal state, the leak current to the transfer transistor to which 0V is applied from the transfer transistor to which Vpass is applied will become large. A dotted line arrow shows the current which flows into the parasitic transistor shown in FIG. 3. This leak current may cause unexpected fault.

Figure 4:
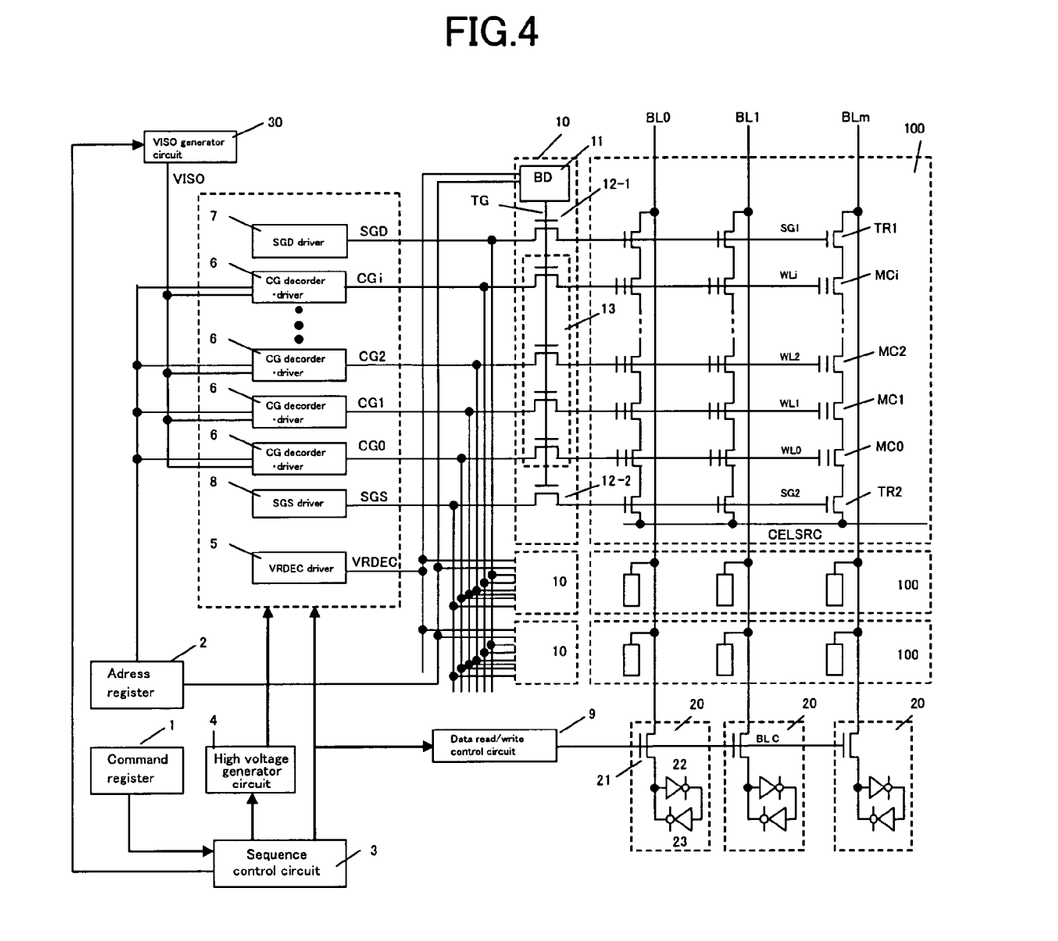
FIG. 4 is a figure showing an embodiment of the configuration of the non-volatile semiconductor memory device of this invention.

A non-volatile semiconductor memory device of an embodiment of the present invention is explained in detail hereafter. FIG. 4 shows the configuration of the NAND type flash memory of an embodiment of the non-volatile semiconductor memory device of this invention. The command register 1 supplies control commands to the sequence control circuit 3. The sequence control circuit 3 supplies control signals to the VRDEC driver 5, two or more CG decoder drivers 6, the SGD driver 7 and the SGS driver 8, the VISO generating circuit 30 mentioned later, the high-voltage generating circuit 4, and data read/program control circuit 9.

100 is a block (memory block) and has two or more memory transistors which share the bit lines BL0-BLm, the word lines WL0-WLi, and the selection gate lines SG1 and SG2. Here, in one block 100, the series connection unit containing the memory transistor sequence (MC0-MCi) and the selection transistors TR1 and TR2 which were connected to one bit line is called a NAND type cell.

10 is a block selection circuit which chooses one block 100. The block selection circuit 10 has the block decoder (BD) 11, the transfer transistors 12 (12-1 and 12-2), and two or more transfer transistors 13. The block decoder (BD) 11 receives and decodes the block address signal from an address register 2, and transmits the output signal to the transfer transistors 12-1, 12-2, and 13 through a level shifter circuit (not shown). The transfer transistors 12-1 and 12-2 are transfer transistors used for the selection gate lines SG1 and SG2 of a NAND type cell, respectively. The selection gate drive line SGD and SGS, and selection gate line SG1 and SG2 are connected to the drain and source of the transfer transistors 12-1 and 12-2, respectively. The transfer transistors 13 are transfer transistors for the word lines WL0–WLi. The word line drive lines CG0-CGi and the word lines WL0–WLi are connected to those drains and sources, respectively. For example, when a NAND type cell consists of 32 memory cells, the string length of a NAND type memory cell is set to 32, and 32 transfer transistors 13 connected to the word lines WL0-WLi are necessary. The SGD driver 7 and the SGS driver 8 supply selection gating signals to the selection gate drive lines SGD and SGS, respectively. Moreover, two or more CG decoder drivers 6 supply word line drive signals to the word line drive lines CG0-CGi, respectively.

The sense amplifier 20 has the bit line voltage control transistor 21 and inverters 22 and 23. The bit line voltage control transistor 21 of the sense amplifier 20 is connected to each bit BL0-Lines BLm and BLC, respectively.

In the non-volatile semiconductor memory device concerning this embodiment, the number of blocks 100 is 1024, the string length of the NAND type memory cell in one block 100 is 32 (WL0-WL31), and page length (the number of the bit lines BL0-BLm) is 2 kByte.

The VISO generating circuit 30 is a circuit which supplies predetermined voltage (VISO and henceforth "bias voltage") to CG decoder driver 6. As for the VISO generating circuit 30, it is desirable to have a trimming function as for which VISO is made variable in a predetermined steps like 0.25V, 0.5V, and 0.75V for example. This VISO generating circuit 30 is connected to all the CG decoder drivers 6. It enables it to output the predetermined voltage VISO from any CG decoder drivers 6 to word lines through the block selection circuit.

Figure 5:
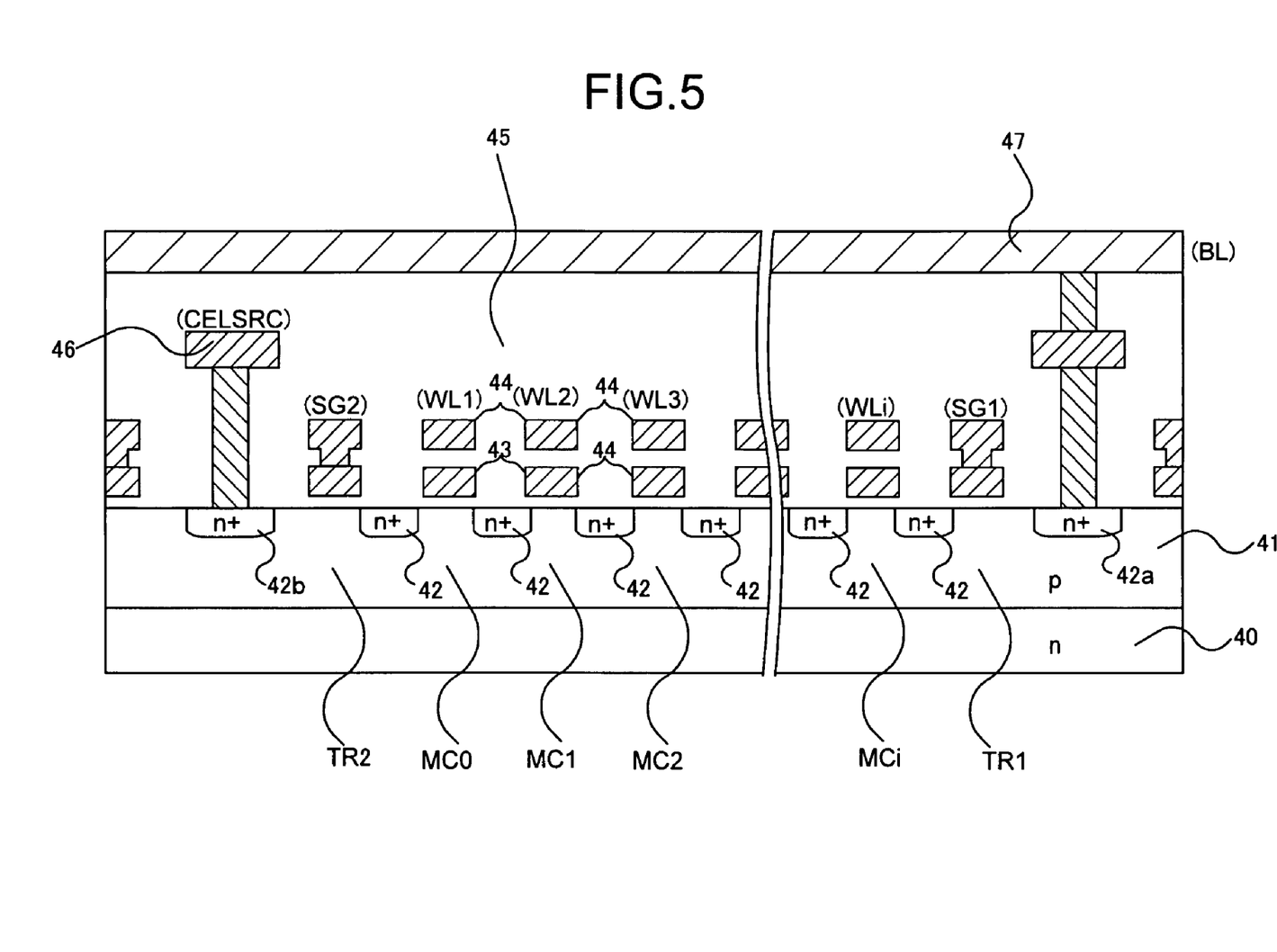
FIG. 5 is a sectional view in an embodiment of the configuration of the non-volatile semiconductor memory device of this invention which meets the bit line BL of one NAND cell unit.

The section along the bit line BL of the NAND cells including one NAND string is shown in FIG. 5. Memory cells MC0-MCi are formed into p type well 41 formed in n type silicon substrate or n type well 40. Memory cells MC0–MCi share source and drain diffusion regions 42 between adjoinings, and have the lamination structure of the floating gate 43 and the control gate 44. The control gate 44 is patterned with the word line WL common to two or more memory cells MC0-MCi of the direction which intersects perpendicularly with the field of this figure. The common source line (CELSRC) 46 in a block is embedded inside of said interlayer insulation film 45, and contacts the source diffusion region 42b of selection gate transistor TR2 in the common source line (CELSRC) side. The bit line (BL) 47 formed on the interlayer insulation film 45 contacts the drain diffusion region 42a of selection gate transistor TR1 by the side of said bit line BL.

Thus, the memory cells MC0-MCi which adjacent within a NAND cell share a diffusion region between a NAND type flash memory, and the adjacent NAND cells shares wiring contact between them. Although detailed explanation is omitted, in the direction which intersects perpendicularly with the field of FIG. 5, the element region and element separation region of the stripe pattern are arranged by turns. Memory cells MC0-MCi are constituted by each intersection of the word line WL of the stripe pattern which intersects perpendicularly with the each element region.

Figure 6:
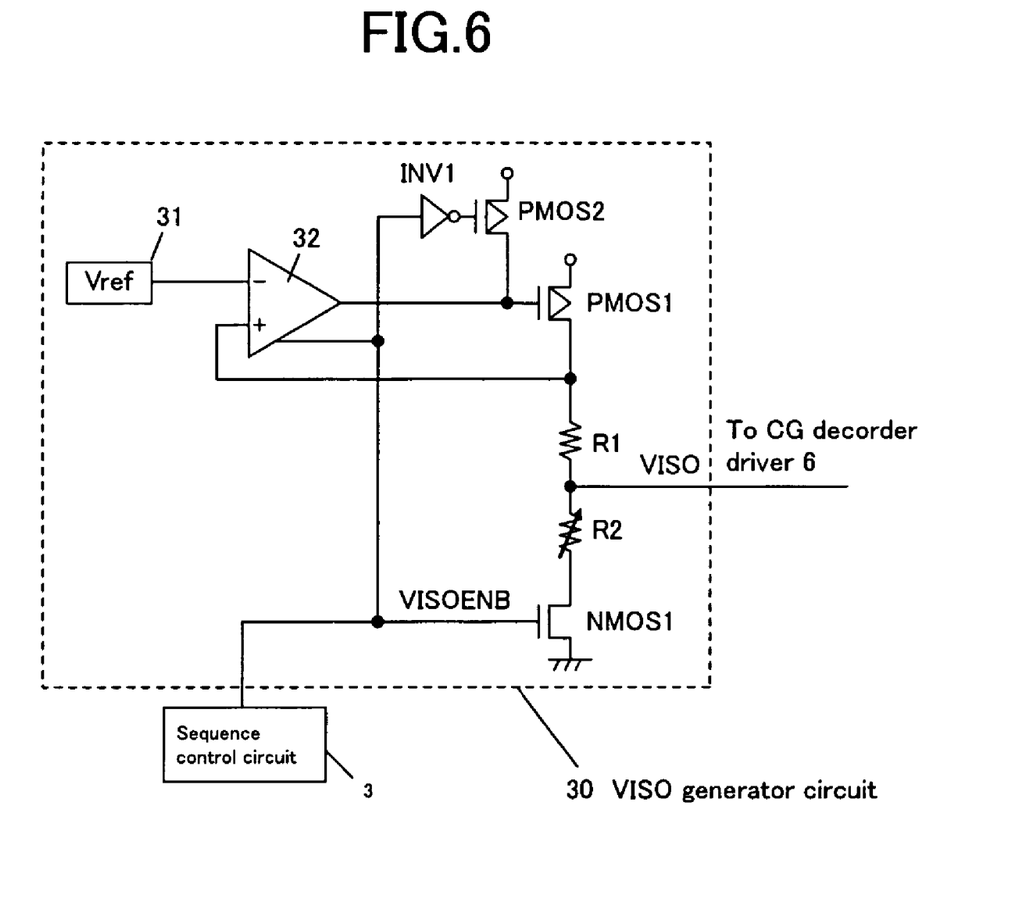
FIG. 6 is an example of a circuit of the VISO generating circuit used for an embodiment of the non-volatile semiconductor memory device of this invention.

Next, FIG. 6 is referred to. The circuit diagram of the VISO generating circuit 30 used for the non-volatile semiconductor memory device of this embodiment is shown in FIG. 6. In addition, the VISO generating circuit 30 is not necessarily restricted to what is shown in FIG. 6, and as long as it is a circuit which can supply predetermined voltage as the meaning of the non-volatile semiconductor memory device of this embodiment, any kind of circuit may be used for it.

The VISO generating circuit 30 has reference voltage power supply (reference power supply, Vref) 31, operational amplifier 32, P channel type MOS transistors PMOS1 and PMOS2, and N channel type MOS transistor NMOS1, resistance R1, and the variable resistance circuit R2. In the VISO generating circuit 30, the value of VISO is changeable by changing the resistance of the variable resistance circuit R2. In addition, although the output voltage of a reference voltage power supply (Vref) is about 1.2V, it is not necessarily limited to this, for example.

The enable signal VISOENB is inputted into NMOS1, INV1, and an operational amplifier 32 from the sequence control circuit 3. The predetermined VISO will be inputted into CG decoder driver 6 to that timing.

Figure 7:
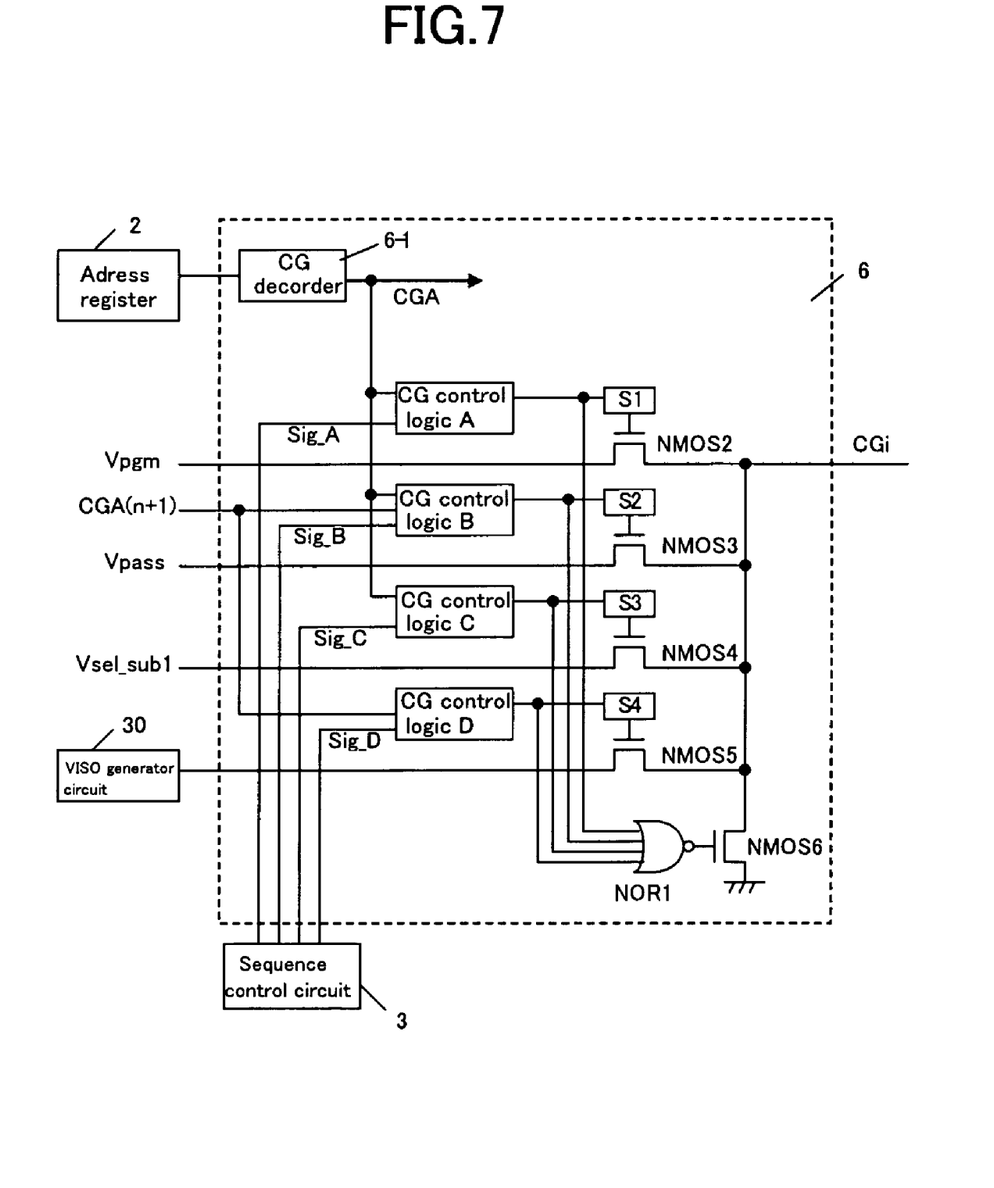
FIG. 7 is an example of a circuit of CG decoder driver 6 used for an embodiment of the non-volatile semiconductor memory device of this invention.

The circuit diagram of CG decoder driver 6 in this embodiment is shown in FIG. 7. FIG. 7 shows typically the circuit diagram of CG decoder driver 6 connected to the word line drive line CGi. CG decoder drivers 6 connected to other word line drive lines are also the same circuit configuration.

CG decoder driver 6 includes the CG decoder 6-1 and the level shift circuits S1 S2, S3, and S4 controlled by CG control logic A, B, C and D, and CG control logic A, B, C, and D. Furthermore, this contains NOR1 and N channel type MOS transistor NMOS2, NMOS3, NMOS4, NMOS5, and NMOS6 by which gate voltage is controlled by the level shift circuit S1, S2, S3 and S4 and NOR1. Vpgm, Vpass, Vsel_sub1, and bias voltage VISO are supplied to NMOS2, NMOS3, NMOS4, and NMOS5, respectively at the time of program operation. CG control logic A receives signal CGA which is a decoded CG address, and signal Sig_A inputted from a sequence control circuit. In predetermined timing, Vpgm is supplied to the selected word line drive line CG under the control of CG control logic A. CG control logic B receives signal CGA which is a decoded CG address, signal CGAn+1 which is a decoded address of the next CG address, and signal Sig_B inputted from the sequence control circuit. In predetermined timing, Vpass is supplied to the non-selected word line drive line CG other than the word line drive line of the next to the selected word line drive line under the control of CG control logic B. CG control logic C receives signal Sig_C inputted from signal CGA which is the decoded CG address, and the sequence control circuit. In predetermined timing, Vsel_sub1 is supplied to the selected word line drive line CG under the control of CG control logic C. CG control logic D receives signal Sig_D inputted from the signal CGAn+1 which is the decoded CG address of the next CG driver, and the sequence control circuit. In predetermined timing, bias voltage VISO is supplied to the word line drive line of a non-selected word line of the next to the selected word line drive line CG under the control of CG control logic D. NOR1 makes CGi into a grounding state, when neither CG control logic A, B, and C nor D is chosen.

In the example shown in FIG. 7, the non-selected word line drive line by which bias voltage VISO is applied is next to the source side of a selected word line (drive line). However, if the position which applies bias voltage VISO is changed, CG decoding signal inputted into CG control logic B and D will be changed suitably.

Moreover, the voltage used for programming operation is not restricted to this example. When the voltage of other kinds is needed, the voltage transfer circuit according to it will be added.

Figure 8:
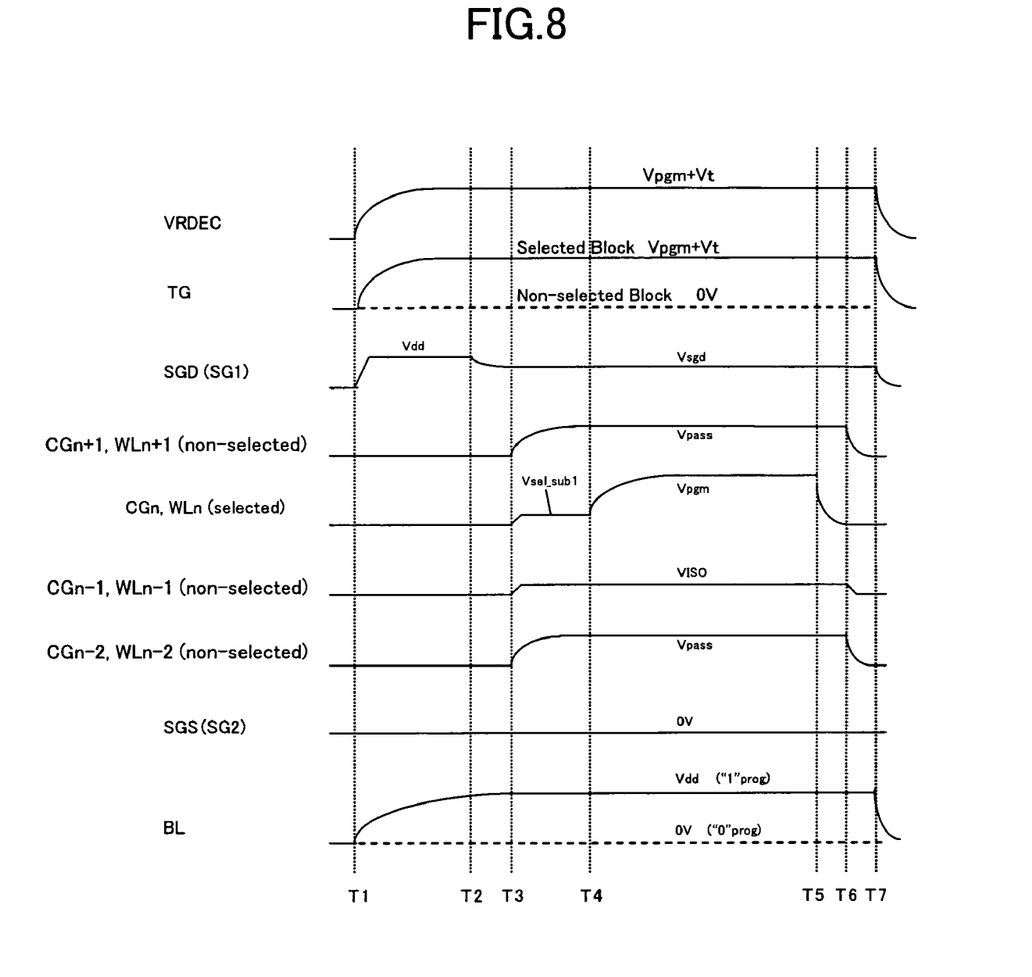
FIG. 8 is a timing chart in program operation in an embodiment of the non-volatile semiconductor memory device of this invention.

Here, with reference to FIG. 8, program operation of the non-volatile semiconductor memory device of this embodiment is explained. The timing chart in the program operation of the non-volatile semiconductor memory device of this embodiment is shown in FIG. 8. In this timing chart, a selected word line is WLn and other word lines are non-selected word lines. In FIG. 8, the timing charts of the selected word line WLn and non-selected word line WLn+1, WLn−1 and WLn−2, the word line drive lines CGn, CGn+1, CGn−1, and CGn−2 corresponding to these word lines, are shown typically. When a transfer transistor is ON, the potentials of the word line drive lines CGn, CGn+1, CGn−1, and CGn−2 are substantially the same as the potentials of the word lines WLn WLn+1, WLn−1, and WLn−2 respectively.

Figure 9:
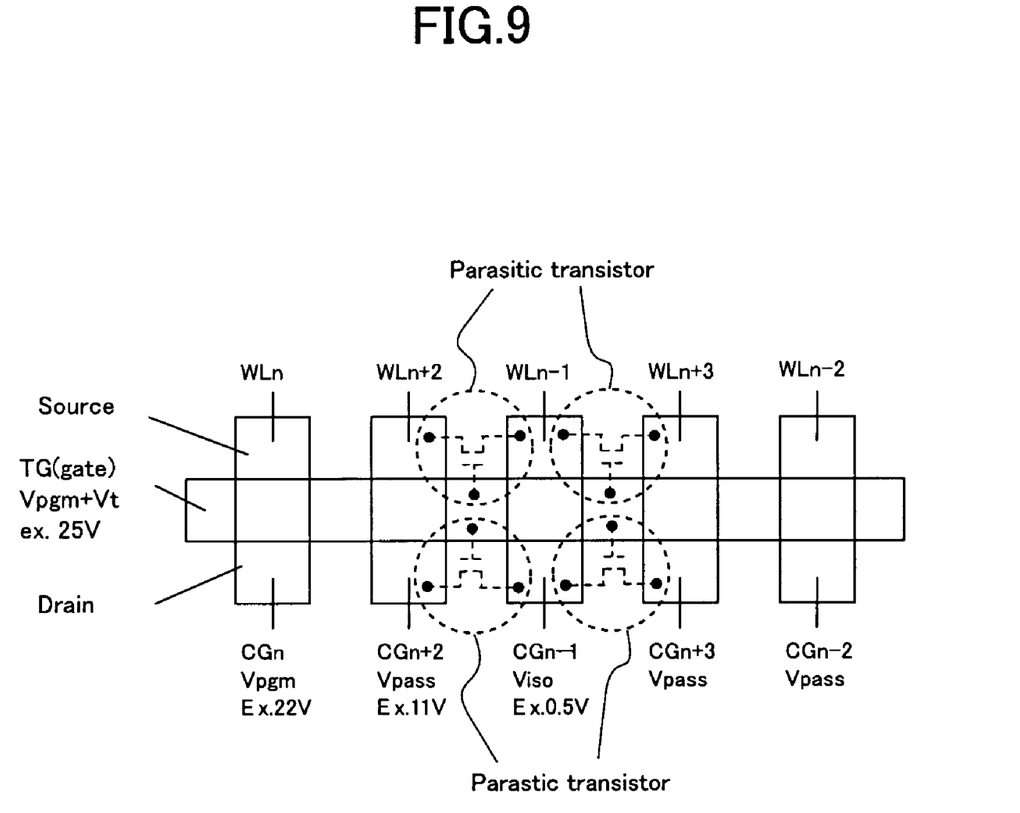
FIG. 9 is a figure showing layout arrangement of the transfer transistor in an embodiment of the non-volatile semiconductor memory device of this invention.

Here, FIG. 9 is referred to. The layout arrangement of the transfer transistors 13 in the block selection circuit in this embodiment is shown in FIG. 9. The layout arrangement plan of FIG. 9 is a layout configuration pattern without gate pattern separation, and is layout arrangement of the transfer transistor which made distance between transistors small. In the layout arrangement shown in FIG. 9, the transfer transistors connected to the word line WLn, WLn+2, WLn−1, WLn+3, and WLn−2 are arranged in this turn. As a result, two transfer transistors corresponding to two word lines whose addresses are adjacent a lengthwise direction and a transverse direction, and are not arranged adjacently. In the programming wave form of FIG. 8, Vpgm is applied to the selected word line WLn, and VISO is applied to the next non-selected word line WLn−1. As a result, the transfer transistor corresponding to the adjacent word line WL does not adjacent. In addition, arrangement of the transfer transistor in the non-volatile semiconductor memory device of this embodiment is not necessarily limited to what is shown in FIG. 9. Each transfer transistor may be made to be arranged so that the transfer transistor corresponding to the transfer transistor corresponding to WLn, WLn+1, or WLn−1 may adjacent depending on the voltage supply method at the time of a program.

FIG. 8 is referred to again. In timing T1, the VRDEC driver applies Vpgm (program voltage (here, it is also called "first voltage V1" hereinafter.)) +Vt (threshold voltage) to the VRDEC. And then, Vpgm+Vt is applied to the gate wiring TG of the transfer transistors 12-1, 12-2, and 3 of the selected block 100. Moreover, in timing T1, Vdd is applied to the selection gate drive line SGD, and 0V is applied to the selection gate drive line SGS. Furthermore, in timing T1, when programming "1" in the bit line BL, Vdd is applied, and when programming "0" in the bit line BL, Vss (=0V) is applied. Therefore, in timing T1, the voltages of the selection gate drive lines SGD and SGS in the selected block 100 is transmitted to SG1 and SG2 through the transfer transistors 12-1 and 12-2, respectively, and a NAND type cell becomes active. And the voltage (Vdd or Vss) according to the program data applied to the bit line BL is supplied to a NAND type cell. In timing T2, Vsgd is applied to the selection gate drive line SGD.

In the timing T3 in the period when Vpgm+Vt is applied to the gate wiring TG of the transfer transistor 13 of a selection block, the voltage beyond 0V is applied to the selected word line and the non-selected word line. In timing T3, the voltage VISO (called "3rd voltage V3" hereinafter, and is 0.5V in this embodiment.) is applied to the non-selected word line WLn−1 which is still 0V. In timing T3, the Vpass (henceforth "the 2nd voltage V2") is applied to the non-selected word lines other than WLn−1. The voltage Vsel_sub1 which is more than the VISO (called "the 4th voltage V4" hereinafter) is applied to the selected word line WLn. In timing T4, Vpgm (first voltage V1) is applied to the selected word line WLn. The relations between the voltages are described below:

$VISO$ (3rd voltage $V3$)<$Vpass$ (2nd voltage $V2$)
  <$Vpgm$ (first voltage $V1$).

Furthermore:

$VISO$(3rd voltage $V3$)<$Vsel\_sub1$ (the 4th voltage).

By applying voltage in this way to a selected word line and a non-selected word line, VISO (in this embodiment, it is 0.5V) is applied to the non-selected word line WLn−1 in timing T3. This is shown in FIG. 9. Conventionally, 0V was applied to the non-selected word line WLn−1. As a result, a well or substrate bias voltage is applied to the transfer transistor connected to selected word line WLn−1. Therefore, the well or substrate bias voltage is applied to the source of the parasitic transistor (field transistor) shown in FIG. 9. Therefore, the threshold voltage of a parasitic transistor can be electrically made high. As a result, the leak current through a parasitic transistor can be controlled. VISO (the 3rd voltage V3) should be higher than the substrate voltage of a parasitic transistor. In the period when Vpgm (the first voltage V1) and Vpass (the 2nd voltage V2) are applied to word lines, VISO (the 3rd voltage V3) is the lowest voltage in the voltage applied to sources or drains of transfer transistors.

At least, as shown in FIG. 4, the output period of VISO is a period when the high voltage is applied to the gate of a transfer transistor, and is a period when the voltage beyond 0V is applied to two or more drains or sources of a transfer transistor which were arranged.

In this embodiment, voltage Vsel_sub1 higher than VISO (the 3rd voltage V3) (the 4th voltage V4) is applied to the selected word line WLn in the period from timings T3 to T4.

As a result, even if the transfer transistor for selected word line WLn and the transfer transistor for non-selected word line WLn−1 or WLn+1 being adjacent, the substrate bias effect is acquired and reduction of leak current can be expected. The voltage of Vsel_sub1 (the 4th voltage V4) may generate and apply desired voltage in a circuit, as shown in FIG. 3. The selected word line WLn may be changed into a floating state, and suitable potential may be obtained by coupling with adjacent wiring of a word line and a word line drive line. When the voltage control methods are changed, controller of CG driver circuits are also changed suitably.

Then, program voltage Vpgm of the selected word line WLn is discharged to 0V at timing T5. In the period from timing T5 to the timing T6, the parasitic transistor (field transistor) of a transfer transistor tends to send leak current. However, the substantial program operation is over after the timing T5. Even if the potential Vpass applied to the non-selected word line drops after electric discharge of a program voltage is completed mostly, there is almost no influence on memory cells. Therefore, according to the grade of the leak current of a parasitic transistor (field transistor), after program voltage supply may use electric discharge operation as usual.

In the non-volatile semiconductor memory device of this embodiment, predetermined voltage is applied from a voltage generating circuit to the specific transfer transistor included in a block selection circuit in a program operation. As a result, the leak current which flows between transfer transistors can be controlled according to the substrate bias effect. And the element separation region between the transistors which are adjacent each other can be made small, and it becomes possible to make small a row decoder including a block selection circuit.

EMBODIMENT 1

This embodiment explains the example which performs a different program operation from above-mentioned embodiment in the non-volatile semiconductor memory device of this invention.

Figure 10:
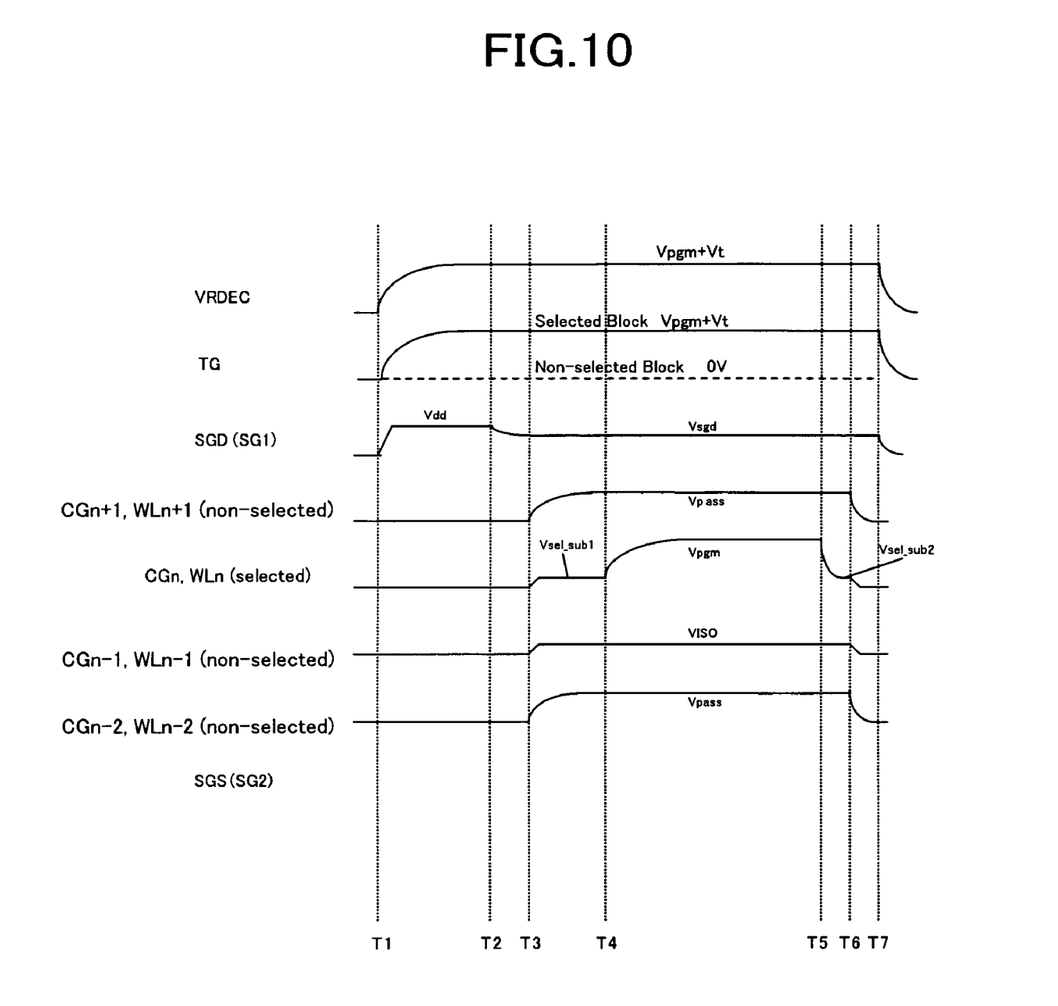
FIG. 10 is a timing chart in program operation in an embodiment of the non-volatile semiconductor memory device of this invention.

FIG. 10 is referred to. FIG. 10 is a timing chart in the program operation of the non-volatile semiconductor memory device of this embodiment. In this timing chart, the word line of a selected word line of WLn and others is a non-selected word line. In the time chart of FIG. 10, like the timing chart of FIG. 8, a selected word line is WLn and non-selected word lines are WLn+1, WLn−1, and WLn−2. The word line drive lines corresponding to these word lines are CGn, CGn+1, CGn−1, and CGn−2. In the non-volatile semiconductor memory device of this embodiment, the program operation to timing T5 is the same as that of operation explained in above-mentioned embodiment and above-mentioned FIG. 8. Therefore, the explanation is omitted.

In this embodiment, program voltage Vpgm of the selected word line WLn is discharged to Vsel_sub2 in the timing T5. It is desirable if Vsel_sub2 is the voltage more than VISO. The voltage of Vsel_sub1 may be the same as the voltage of Vsel_sub2, and may differ from each other. If the voltage of Vsel_sub2 differs from the voltage of Vsel_sub1, CG decoder driver 6 will be designed to output different Vsel_sub2 and Vsel_sub1.

Then, after all the word line voltage is discharged at the timing T6, the source of a parasitic transistor (field transistor) and the potential difference between drains will be zero. Since supply of VISO becomes unnecessary, supply of VISO of non-selected word line WLn−1 is halted.

In the non-volatile semiconductor memory device of this embodiment, predetermined voltage is applied from a voltage generating circuit to the specific transfer transistor included in a block selection circuit in a program operation. Therefore, the leak current which flows between transmission transistors can be controlled according to the substrate bias effect. As a result, the element isolation region between the adjoining transistors can be made small. Therefore, it becomes possible to make small a row decoder including a block selection circuit.

EMBODIMENT 2

This embodiment explains the example which performs a program operation which is different in the above-mentioned embodiment 1 and 2 in the non-volatile semiconductor memory device of this invention.

Figure 11:
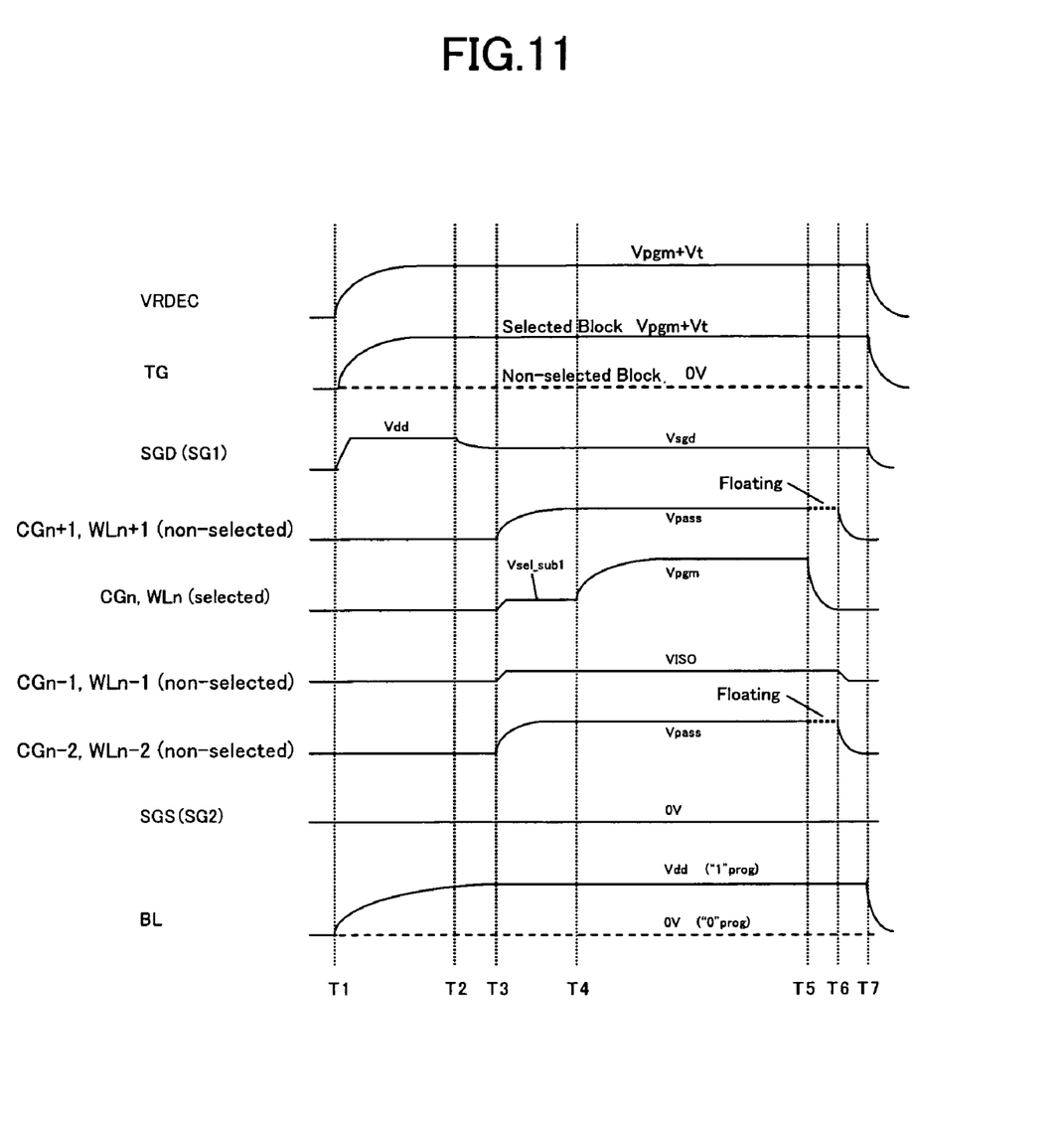
FIG. 11 is a timing chart in program operation in an embodiment of the non-volatile semiconductor memory device of this invention.

FIG. 11 is referred to. FIG. 11 is a timing chart in the program operation of the non-volatile semiconductor memory device of this embodiment. In this timing chart, a selected word line is WLn and other word lines are non-selected word lines. In the time chart of FIG. 11, like the timing chart of FIG. 8, a selected word line is WLn and non-selected word lines are WLn+1, WLn−1, and WLn−2. The word line drive lines corresponding to these word lines are CGn, CGn+1, CGn−1, and CGn−2. In the non-volatile semiconductor memory device of this embodiment, the program operation to timing T5 is the same as that of operation explained in above-mentioned embodiment and above-mentioned FIG. 8. Therefore, the explanation is omitted.

When discharging program voltage Vpgm of the selected word line WLn at the timing T5, the selected word line WLn is made to discharge to 0V in this embodiment as shown in FIG. 11. Thereby, in the period from the timing T5 to the timing T6, leak current flows into a transfer transistor via a parasitic transistor. When the state where Vpass is applied by a non-selected word line in the period from the timing T5 to the timing T6 is continued, leak current will continue to be sent vainly. Then, the non-selected word line which supplies Vpass during the period starting from the timing T5 to the timing T6 is changed into a floating state.

The arrangement of the transmission transistors is shown in FIG. 9. In this arrangement, field leak occurs around the transmission transistor connected to the selected word line (0V). The voltage of a non-selected word lines (floating) and the voltage of the word line drive lines drop in response to the influence of the field leak. However, in this arrangement, the transmission transistor to which Vpgm is supplied, and the transmission transistor to which VISO is supplied are not adjacent to each other. As a result, a possibility that VISO will drop directly by the leak current from the field transistor is low. Therefore, when performing a program operation like this embodiment, it can prevent that the leak current by the drops of Vpass increases.

In the above embodiment, the case where bias voltage VISO was applied to the non-selected word line next to a selected word line is shown. However, the position of the non-selected word line which applies bias voltage VISO is not restricted to this. When the position of a non-selected word line where bias voltage VISO is applied is changed, arrangement is changed according to this. For example, when bias voltage VISO is applied to the non-selected word line which separated two from the selected word line, the row of the transfer transistor shown in FIG. 9 is also changed according to it. That is, the method of arrangement of the transfer transistor of FIG. 9 is optimized so that the potential difference which uses the regularity of the voltage applied to two or more word lines, and is applied to the adjacent transfer transistor may become small. By using supply of bias voltage VISO of this embodiment, it becomes possible to reduce the arrangement interval of a transfer transistor more.

According to the non-volatile semiconductor memory device of the embodiment of this invention, the element separation region between the adjacent transistors can be made small, and it becomes possible to make small row decoders including block selection circuits. Therefore, according to this embodiment, small size and large capacity non-volatile semiconductor memory devices are realizable. The non-volatile semiconductor memory device of this embodiment can be used as storage apparatus of electric devices, such as a computer, a digital camera, a cellular phone, and home electronics.

What is claimed is:

1. A nonvolatile semiconductor memory device comprising:
   a memory cell array having a plurality of blocks each including a plurality of electrically reprogrammable nonvolatile memory cells;
   a first circuit for selecting one from said plurality of blocks, said first circuit having a plurality of transistors connected to word lines connected to some of said nonvolatile memory cells; and
   a second circuit for generating a first voltage V1, a second voltage V2 and a third voltage V3 (V3<V2<V1), said first voltage V1 being applied to a source or drain of one of said transistors connected to a selected word line at a timing of programming, said second voltage V2 being applied to sources or drains of some of said transistors connected to non-selected word lines at the timing of programming, and said third voltage V3 being applied to a source or a drain of one of said transistors connected to at least one of said non-selected word lines at the timing of programming, said third voltage V3 being higher than a well or substrate voltage of said plurality of transistors.

2. The nonvolatile semiconductor memory device according to claim 1, wherein transistors connected to said selected word line and to which said first voltage V1 being applied at the timing of programming, and transistors connected to said non-selected word lines and to which said third voltage V3 being applied at the timing of programming are separated and allocated in vertical and horizontal directions, respectively.

3. The nonvolatile semiconductor memory device according to claim 1, wherein said second circuit generates said third voltage V3 by using a predetermined reference voltage.

4. The nonvolatile semiconductor memory device according to claim 2, wherein said second circuit generates said third voltage V3 by using a predetermined reference voltage.

5. The nonvolatile semiconductor memory device according to claim 1, wherein said second circuit is capable of changing said third voltage V3 in a predetermined step.

6. The nonvolatile semiconductor memory device according to claim 2, wherein said second circuit is capable of changing said third voltage V3 in a predetermined step.

7. The nonvolatile semiconductor memory device according to claim 1, wherein said second voltage V2 and the third voltage V3 are applied to corresponding said transistors connected to said non-selected word lines simultaneously before said first voltage V1 is applied to corresponding said transistor connected to said selected word line, and a fourth voltage V4 (V3<V4) is applied to corresponding said transistors connected to said selected word line in the period from the timing when said second voltage V2 and said third voltage V3 are applied to corresponding said transistors connected to said non-selected word lines to the timing when said first voltage V1 is applied to corresponding said transistors connected to said selected word line.

8. The nonvolatile semiconductor memory device according to claim 2, wherein said second voltage V2 and the third voltage V3 are applied to corresponding said transistors connected to said non-selected word lines simultaneously before said first voltage V1 is applied to corresponding said transistor connected to said selected word line, and a fourth voltage V4 (V3<V4) is applied to corresponding said transistors connected to said selected word line in the period from the timing when said second voltage V2 and said third voltage V3 are applied to corresponding said transistors connected to said non-selected word lines to the timing when said first voltage V1 is applied to corresponding said transistors connected to said selected word line.

9. The nonvolatile semiconductor memory device according to claim 1, wherein each of said memory cell arrays has a structure in which said plurality of memory cells are connected between two selection gates.

10. The nonvolatile semiconductor memory device according to claim 9, wherein each of said plurality of memory cells has a stacked structure of a floating gate and a control gate.

11. A method for driving word lines of a nonvolatile semiconductor memory device comprising:
   applying a first voltage V1 to a source or drain of one of a plurality of transistors connected to a selected word line at a timing of programming;
   applying a second voltage V2 to sources or drains of some of said transistors connected to non-selected word lines at the timing of programming; and
   applying a third voltage V3 (V3<V2<V1) to a source or a drain of one of said transistors connected to one of said non-selected word lines at the timing of programming, said third voltage V3 being higher than a well or substrate voltage of said plurality of transistors, and said third voltage being the lowest among voltages applied to said sources or drains of said plurality of transistors applied in a period of said first voltage V1 and said second voltage V2 being applied to corresponding said word lines.

12. The method for driving word lines of the nonvolatile semiconductor memory device according to claim 11, wherein said transistors connected to said selected word line and to which said first voltage V1 being applied at the timing of programming, and said transistors connected to said non-selected word lines and to which said third voltage V3 being applied at the timing of programming are separated and allocated in vertical and horizontal directions, respectively.

13. The method for driving word lines of the nonvolatile semiconductor memory device according to claim 11, wherein said nonvolatile semiconductor device comprises a second circuit generating said third voltage V3 by using a predetermined reference voltage.

14. The method for driving word lines of the nonvolatile semiconductor memory device according to claim 12, wherein said nonvolatile semiconductor device comprises a second circuit generating said third voltage V3 by using a predetermined reference voltage.

15. The method for driving word lines of the nonvolatile semiconductor memory device according to claim 11, wherein said second circuit is capable of changing said third voltage V3 in a predetermined interval value.

16. The method for driving word lines of the nonvolatile semiconductor memory device according to claim 12, wherein said second circuit is capable of changing said third voltage V3 in a predetermined interval value.

17. The method for driving word lines of the nonvolatile semiconductor memory device according to claim 11, said second voltage V2 and said third voltage V3 are applied to corresponding said transistors connected to said non-selected word lines simultaneously before said first voltage V1 is applied to corresponding said transistor connected to said selected word line, and a fourth voltage V4 (V3<V4) is applied to corresponding said transistors connected to said selected word line in the period from the timing when said second voltage V2 and said third voltage V3 are applied to corresponding said transistors connected to said non-selected word lines to the timing when said first voltage V1 is applied to corresponding said transistors connected to said selected word line.

18. The method for driving word lines of the nonvolatile semiconductor memory device according to claim 12, the second voltage V2 and the third voltage V3 are applied to corresponding said transistors connected to said non-selected word lines simultaneously before said first voltage V1 is applied to corresponding said transistor connected to said selected word line, and a fourth voltage V4 (V3<V4) is applied to corresponding said transistors connected to said selected word line in the period from the timing when said second voltage V2 and said third voltage V3 are applied to corresponding said transistors connected to said non-selected word lines to the timing when said first voltage V1 is applied to corresponding said transistors connected to said selected word line.

19. The method for driving word lines of the nonvolatile semiconductor memory device according to claim 11, wherein each of said memory cell arrays has a structure in which said plurality of memory cells are connected between two selection gates.

20. The method for driving word lines of the nonvolatile semiconductor memory device according to claim 19, wherein each of said plurality of memory cells has a stacked structure of a floating gate and a control gate.

* * * * *